United States Patent
Leong et al.

(10) Patent No.: US 7,423,915 B2
(45) Date of Patent: Sep. 9, 2008

(54) RANDOM CACHE READ USING A DOUBLE MEMORY

(75) Inventors: Nancy Leong, Sunnyvale, CA (US); Sachit Chandra, Sunnyvale, CA (US); Hounien Chen, Fremont, CA (US)

(73) Assignee: Spansion LLC, Sunnyvale, CA (US)

( * ) Notice: Subject to any disclaimer, the term of this patent is extended or adjusted under 35 U.S.C. 154(b) by 256 days.

(21) Appl. No.: 11/332,241

(22) Filed: Jan. 17, 2006

(65) Prior Publication Data

US 2007/0165458 A1 Jul. 19, 2007

(51) Int. Cl.
*G11C 7/10* (2006.01)
*G11C 7/00* (2006.01)

(52) U.S. Cl. .............. 365/189.05; 365/185.12; 365/185.33; 365/189.2

(58) Field of Classification Search ............. 365/189.05
See application file for complete search history.

(56) References Cited

U.S. PATENT DOCUMENTS

| | | | |
|---|---|---|---|
| 5,280,594 A | 1/1994 | Young et al. | |
| 5,973,989 A * | 10/1999 | Pawlowski | 365/233 |
| 6,154,808 A | 11/2000 | Nagase et al. | |
| 6,178,479 B1 | 1/2001 | Vishin | |
| 6,282,624 B1 | 8/2001 | Kimura et al. | |
| 6,304,510 B1 | 10/2001 | Nobunaga et al. | |
| 6,374,337 B1 * | 4/2002 | Estakhri | 365/189.01 |
| 6,377,500 B1 | 4/2002 | Fujimoto et al. | |
| 6,377,507 B1 | 4/2002 | Tsao | |
| 6,388,908 B1 | 5/2002 | Araki et al. | |
| 6,412,080 B1 | 6/2002 | Fleming et al. | |
| 6,622,201 B1 | 9/2003 | VanBuskirk et al. | |
| 7,050,337 B2 * | 5/2006 | Iwase et al. | 365/189.05 |
| 7,062,619 B2 * | 6/2006 | Dvir et al. | 711/103 |
| 7,123,521 B1 * | 10/2006 | Louie et al. | 365/189.05 |
| 7,212,440 B2 * | 5/2007 | Gorobets | 365/185.11 |
| 7,215,580 B2 * | 5/2007 | Gorobets | 365/189.02 |
| 2002/0041527 A1 | 4/2002 | Tanaka et al. | |
| 2002/0130334 A1 | 9/2002 | Gastaldi et al. | |
| 2003/0067808 A1 | 4/2003 | Tuan et al. | |

(Continued)

FOREIGN PATENT DOCUMENTS

EP 1 223 586 7/2002

(Continued)

OTHER PUBLICATIONS

Co-pending U.S. Appl. No. 11/189,923, filed Jul. 27, 2005; entitled: "Improved Read Mode for Flash Memory", by Hounien Chen et al., 25 pages.

(Continued)

*Primary Examiner*—Son L Mai
(74) *Attorney, Agent, or Firm*—Harrity Snyder, LLP

(57) ABSTRACT

A non-volatile memory, such as a Flash memory, is configured to perform a random multi-page read operation. The memory may include a core array of non-volatile memory cells and input lines for receiving an indication of the random multi-page read operation. Further, the memory may include a multi-level volatile memory coupled to the core array that is configured to simultaneously process multiple pages of data from the core array in a pipelined manner. Output lines are coupled to the multi-level volatile memory and output the pages of data from the memory device.

17 Claims, 5 Drawing Sheets

U.S. PATENT DOCUMENTS

| | | | |
|---|---|---|---|
| 2003/0076719 A1 | 4/2003 | Byeon et al. | |
| 2003/0117861 A1 | 6/2003 | Maayan et al. | |
| 2004/0062080 A1 | 4/2004 | Kato | |
| 2004/0133755 A1 | 7/2004 | Chambers | |
| 2005/0226046 A1 | 10/2005 | Lee et al. | |
| 2005/0257120 A1* | 11/2005 | Gorobets et al. | 714/763 |
| 2006/0245247 A1* | 11/2006 | Yano et al. | 365/185.08 |
| 2006/0245270 A1* | 11/2006 | Louie et al. | 365/189.05 |
| 2007/0064480 A1* | 3/2007 | Kuo et al. | 365/185.03 |
| 2007/0097774 A1* | 5/2007 | Mitani et al. | 365/230.02 |

FOREIGN PATENT DOCUMENTS

| | | |
|---|---|---|
| EP | 1 513 160 | 3/2005 |
| WO | WO 00/30116 | 5/2000 |

OTHER PUBLICATIONS

2002 IEEE International Solid-State Circuits Conference, Session 6, "SRAM and Non-Volatile Memories", Feb. 4, 2004, 6 pages.

2002 IEEE International Solid-State Circuits Conference, 23 pages.

International Search Report for corresponding PCT Application No. PCT/US2006/046397.

\* cited by examiner

RANDOM CACHE READ USING A DOUBLE MEMORY

TECHNICAL FIELD

The present invention relates generally to non-volatile memory devices, and more specifically, to data read operations from non-volatile memory devices.

BACKGROUND ART

Flash memory is a common type of non-volatile semiconductor memory device. Non-volatile refers to the trait of retaining stored data when power is turned off. Because Flash memory is non-volatile, it is commonly used in power conscious applications, such as in battery powered cellular phones, personal digital assistants (PDAs), and in portable mass storage devices such as memory sticks.

Flash memory devices typically include multiple individual components formed on or within a substrate. Such devices often comprise a high density section and a low density section. For example, a Flash memory may include one or more high density core regions and a low density peripheral portion formed on a single substrate. The high density core regions typically include arrays of individually addressable, substantially identical floating-gate type memory cells. The low density peripheral portion may include input/output (I/O) circuitry, circuitry for selectively addressing the individual cells (such as decoders for connecting the source, gate and drain of selected cells to predetermined voltages or impedances to effect designated operations of the cell such as programming, reading or erasing), and voltage regulation and supply circuitry.

In one particular type of Flash memory architecture, called NOR Flash memory, memory cells within the core portion are coupled together in a circuit configuration in which each memory cell has a drain, a source, and a stacked gate. In operation, memory cells may be addressed by circuitry in the peripheral portion to perform functions such as reading, erasing, and programming of the memory cells.

Read times for Flash memory devices are typically slower than for volatile memory technologies such as dynamic random access memory (DRAM). Accordingly, it is desirable to improve the effective read time of Flash memory devices.

DISCLOSURE OF THE INVENTION

One aspect is directed to a non-volatile memory device including support for a random multi-page read operation. The memory device includes a core array of non-volatile memory cells; input lines for receiving an indication of the random multi-page read operation, including an identification of a number of pages of data that are to be read from the core array; a volatile memory coupled to the core array and configured to simultaneously process multiple ones of the pages of data from the core array in a pipelined manner; and output lines coupled to the volatile memory and configured to output the pages of data from the memory device.

Another aspect is directed to a memory device comprising a core array of non-volatile memory cells; a first output memory coupled to the core array and configured to receive pages of data from the core array; and a second output memory coupled to the first output memory and configured to receive the pages of data from the first output memory. The core array, the first output memory, and the second output memory perform a page transfer of a first page of data between the core array, the first output memory, and the second output memory in a first pipeline stage while simultaneously performing a page transfer of a second page of data from the second output memory and off of the memory device in a second pipeline stage.

BRIEF DESCRIPTION OF THE DRAWINGS

Reference is made to the attached drawings, wherein elements having the same reference number designation may represent like elements throughout.

BEST MODE FOR CARRYING OUT THE INVENTION

Techniques described below relate to performing random page read operations from a Flash memory device. This random page read technique may use double output memories to improve page read speed when reading multiple pages.

Memory Device Overview

Figure 1:
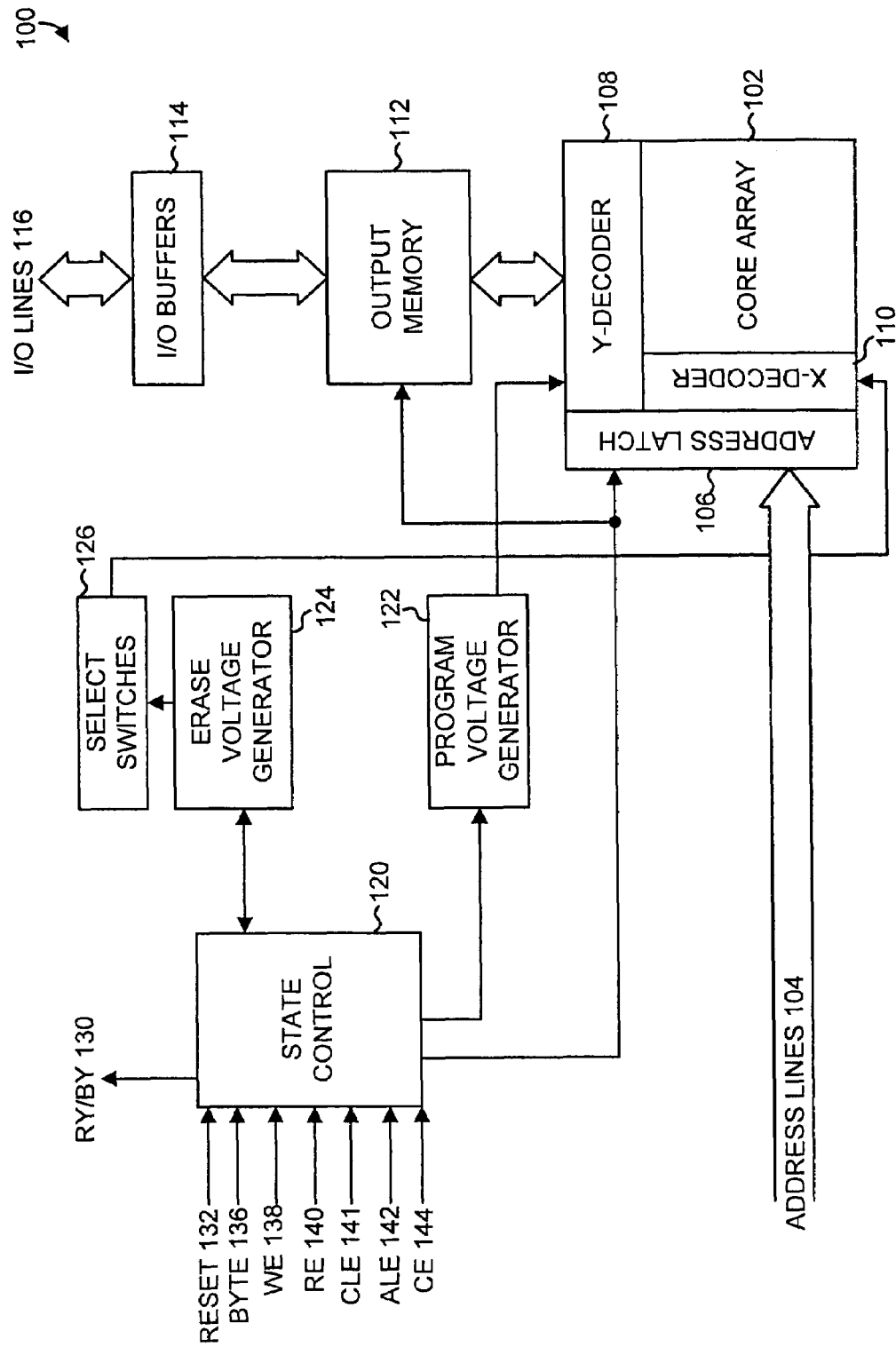
FIG. 1 is a block diagram illustrating an exemplary high-level implementation of a memory device.

FIG. 1 is a block diagram illustrating an exemplary high-level implementation of a memory device 100. Memory device 100 may be a Flash memory device implemented as an integrated circuit.

As shown in FIG. 1, memory device 100 includes a core array 102. Core array 102 may include arrays of high density memory cells, such as, for example, SONOS-type (silicon-oxide-nitride-oxide-silicon) memory cells, where the nitride layer acts as the charge storage element. More specifically, core array 102 may include multiple MxN memory arrays of substantially identical memory cells. Core array 102 may be a sequential access memory in which data is accessed one page at a time. Physically, a page of data may refer to a particular column or row of memory cells in core array 102. Logically, pages can be thought of as blocks of data having predetermined sizes through which memory device 100 is accessed. In one implementation, the page size for memory device 100 is approximately two-thousand bytes (i.e., 2 k bytes).

Core array 102 may be accessed by providing an address for a page via address lines 104 to address latch 106. Address latch 106 may latch the incoming address values and distribute them to Y-decoder 108 and X-decoder 110. Decoders 108 and 110 may decode the address values so that the source, gate, and drains of the memory cells referred to by the latched address are activated and their data values read. For instance, a page of data may be activated and read out of core array 102 in parallel. The read data may be written to output memory 112 before being clocked to input/output (I/O) buffers 114 and read out via I/O lines 116.

In some implementations, the memory cells in array 102 may be implemented such that each memory cell can store two or more bits. In one such multi-bit per memory cell technology, called MirrorBit™, the intrinsic density of a Flash memory array can be doubled by storing two physically distinct charges on opposite sides of a memory cell. Each charge, representing a bit within a cell serves as binary unit of data (e.g. either "1" or "0").

Reading or programming one side of a memory cell occurs independently of the data that is stored on the opposite side of the cell.

Output memory 112 may include static random access memory (SRAM) type memory cells. Output memory 112 may thus be a volatile memory (i.e., loses its data when powered down) and, relative to the memory cells in core array 102, may be a high speed memory. Consistent with an aspect of the invention, and as described in more detail below, output memory 112 may be structured as a multi-level memory having first and second level memories to improve memory read speed when reading multiple pages of data.

As also shown in FIG. 1, memory device 100 can include a number of additional logic components that assist in reading/writing to core array 102. In particular, as shown, memory device 100 includes a state control component 120, a program voltage generator 122, an erase voltage generator 124, and select switches 126.

State control component 120 may implement a state machine that dictates the function of memory device 100 based on a number of control signals, illustrated as the signals: reset line 132, byte line 136, write enable (WE) line 138, read enable (RE) line 140, command latch enable (CLE) line 141, address latch enable (ALE) line 142, and chip enable line 144. Reset line 132, when activated, causes a hardware reset of memory device 100. Byte line 136 selects the width of the output data bus. For example, byte line 136 may cause I/O lines 116 to function as an eight-bit data bus or a sixteen-bit data bus, depending on the state of byte line 136. RE line 140 may be used to control the transfer of data off of memory device 100. CE line 144 may generally be used to enable or disable memory device 100. WE line 138, 140, CLE line 141, ALE line 142, and CE line 144 together control the reading and writing of data to device 100. Depending on the various states of these four signals, the designer may control memory device 100 to be in either an address cycle in which memory device 100 receives a page or block address, a command cycle in which memory device 100 receives a command such as the type of read command, or a data cycle in which memory device 100 receives data to store. Additionally RE 140 and CE 144 may control serial reading out of data to I/O lines 116.

Program voltage generator 122 and erase voltage generator 124 may generate the appropriate voltages needed for reading and writing from/to core array 102. For example, in one implementation, core array 102 may require relatively high voltages to erase and program the memory cells in core array 102. These higher voltages may be provided from program voltage generator 122 and erase voltage generator 124.

Select switches 126 may include select transistors connected to core array 102. Each select switch may be used to control a series of memory cells, such as a column of memory cells.

Also shown in FIG. 1 is ready/busy (RY/BY) line 130. Ready/busy line 130 may indicate when memory device 100 is performing an embedded program/erase operation or read operation. More specifically, when in the "busy" state, ready/busy line 130 indicates that memory device 100 is currently performing a program/erase operation or read operation. When in the "ready" state, ready/busy line 130 indicates that memory device 100 is not currently performing program/erase operation or read operation.

Output Memory 112

Figure 2:
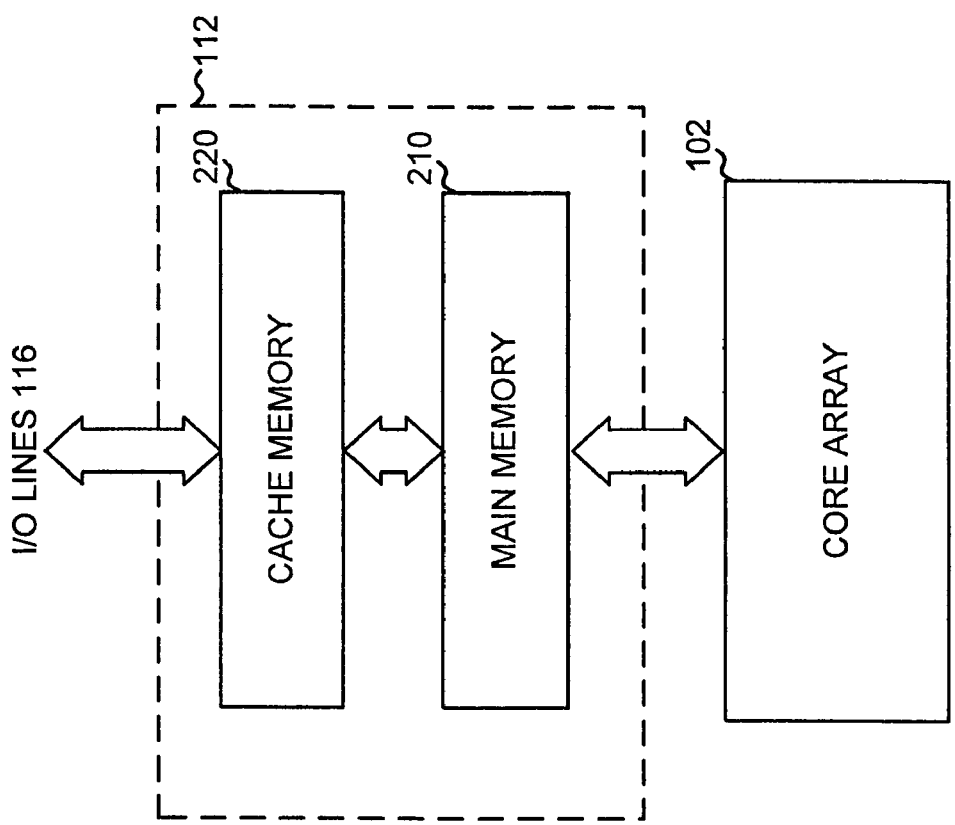
FIG. 2 is an exemplary diagram illustrating the output memory shown in FIG. 1 in additional detail.

FIG. 2 is an exemplary diagram illustrating output memory 112 in additional detail. As shown, output memory 112 includes first and second level memories, labeled as main memory 210 and cache memory 220. During a read operation, main memory 210 may receive a page of data from core array 102. Concurrently with main memory 210 receiving a page of data, cache memory 220 may be transferring a previously requested page of data through I/O buffers 114 to I/O lines 116.

Main memory 210 and cache memory 220 can be implemented using a relatively fast (i.e., short read and write times) memory technology compared to the memory cells in core array 102 and/or the clocking out rate for I/O lines 116. For example, main memory 210 and cache memory 220 may be implemented as SRAM.

In one exemplary implementation, a page of data may be defined as being two KBytes in size and main memory 210 and cache memory 220 may similarly be implemented as two KByte memories. In such an implementation, exemplary memory read times may be: 25 microseconds (μs) to read a page from core array 102 to main memory 210, 300 nanoseconds (ns) to read a page from main memory 210 to cache memory 220, and 21 μs (when byte line 136 is set to sixteen bit bus mode) to output the page from cache memory 220 to I/O lines 116. It should be understood that these memory read times are exemplary only and shorter or longer read/transfer times may exist in alternative implementations consistent with the invention.

Figure 3:
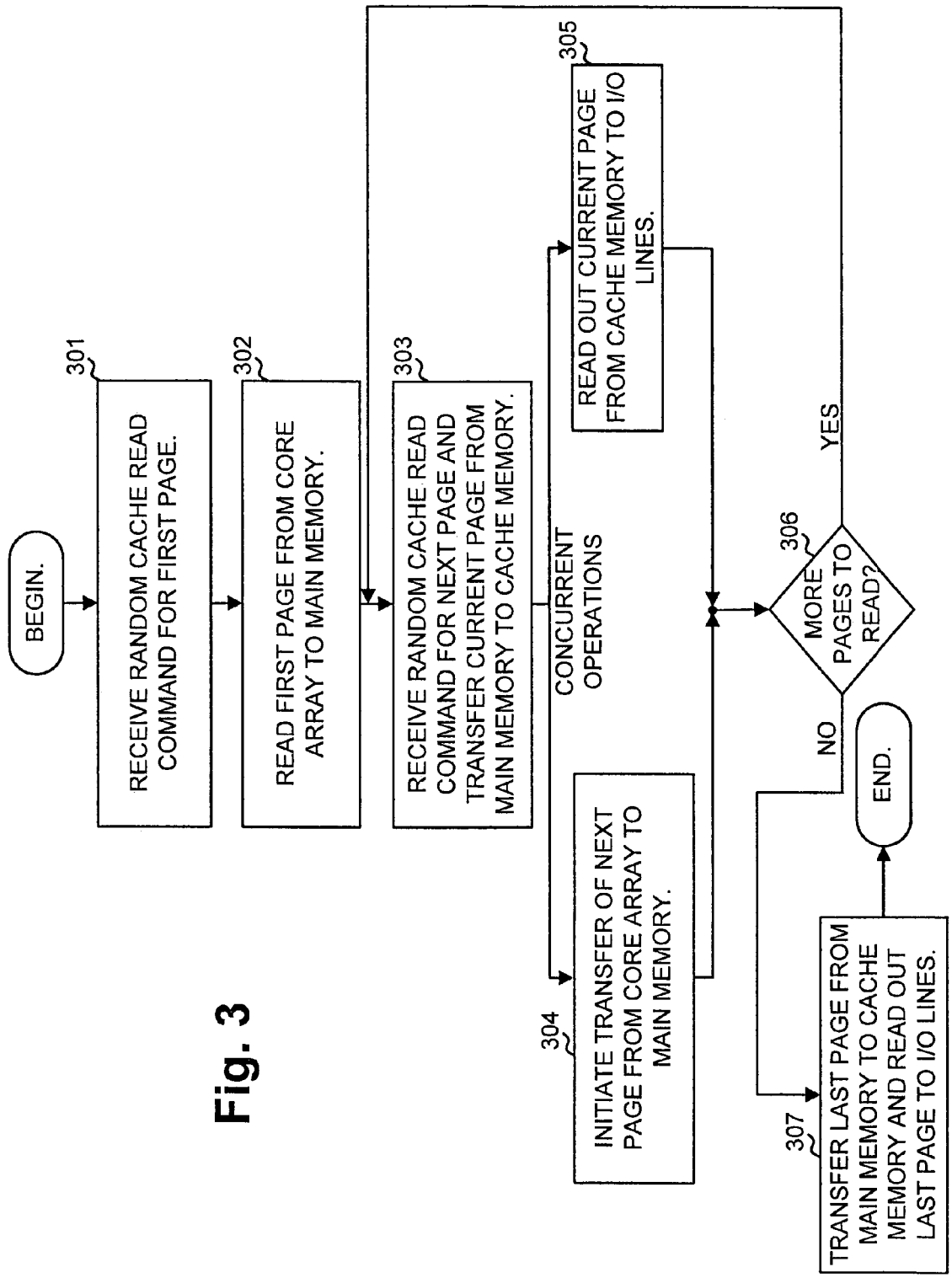
FIG. 3 is a flow chart illustrating exemplary operations for performing a multiple page read operation from the memory device shown in FIG. 1.

FIG. 3 is a flow chart illustrating exemplary operations for performing a multiple page read operation from memory device 100. This multi-page read operation may begin when a read command is received that indicates that multiple pages are to be read (act 301). This type of command will be referred to as a "multi-page read operation" herein. Typically, external circuitry may initiate the multi-page read operation by, for example, inputting the command/address on the I/O lines with CLE/ALE and CE lines activated, setting byte line 136 to select whether eight or sixteen of I/O lines 116 will be used, and placing an appropriate page address on address lines 104. Multiple different page addresses may be input to memory device 100. The different page addresses may be random page addresses in relation to one another. A random page address, as this term is used herein, refers to a page address that is not necessarily sequentially arranged in core array 102. In other words, the multiple different page addresses received by memory device 100 may each refer to any arbitrary page in core array 102.

In some implementations, the multiple different pages that are to be read in the multi-page read operation may be specified as multiple pages that are to be read based on a single starting page address. In other implementations, the multi-page read operation may be specified as an initial one or more page address requests followed by, before the initial multi-page read operation completes, additional page addresses that are to be read.

The first page specified by the multi-page read operation may be read from core array 102 to main memory 210 (act 302). This transfer may take approximately 25 μs.

The page may then be transferred to cache memory 220 (act 303). As mentioned, this may be a relatively fast transfer that can take, for example, approximately 300 ns. At potentially the same time, multi-page read operation command that includes an address of the next page may be received by the memory device (act 303). After a page is initially loaded into cache memory 220, subsequent pages in a multi-page read operation can be performed in a pipelined manner. More specifically, a page transfer from core array 102 to main memory 210 can be initiated (act 304). Simultaneously, the page that is in cache memory 220 may be read-out on I/O lines 116 (act 305). In one implementation, a page transfer to I/O data lines 116 may take approximately 42 μs when transferring the page a byte at a time (i.e., byte line 136 is set to an eight-bit data bus) or 21 μs when transferring the page a word (two bytes) at a time (i.e., byte line 136 is set to a sixteen-bit data bus).

Acts 303, 304 and 305 may be repeated for additional pages in the multi-page read command (act 306). Act 304 represents the first stage of the pipeline and act 305 the second stage. When the final page of the multi-page read command is transferred from core array 102 to main memory 210, the final page may then be transferred to cache memory 220 and read out of I/O lines 116 (act 307).

Figure 4:
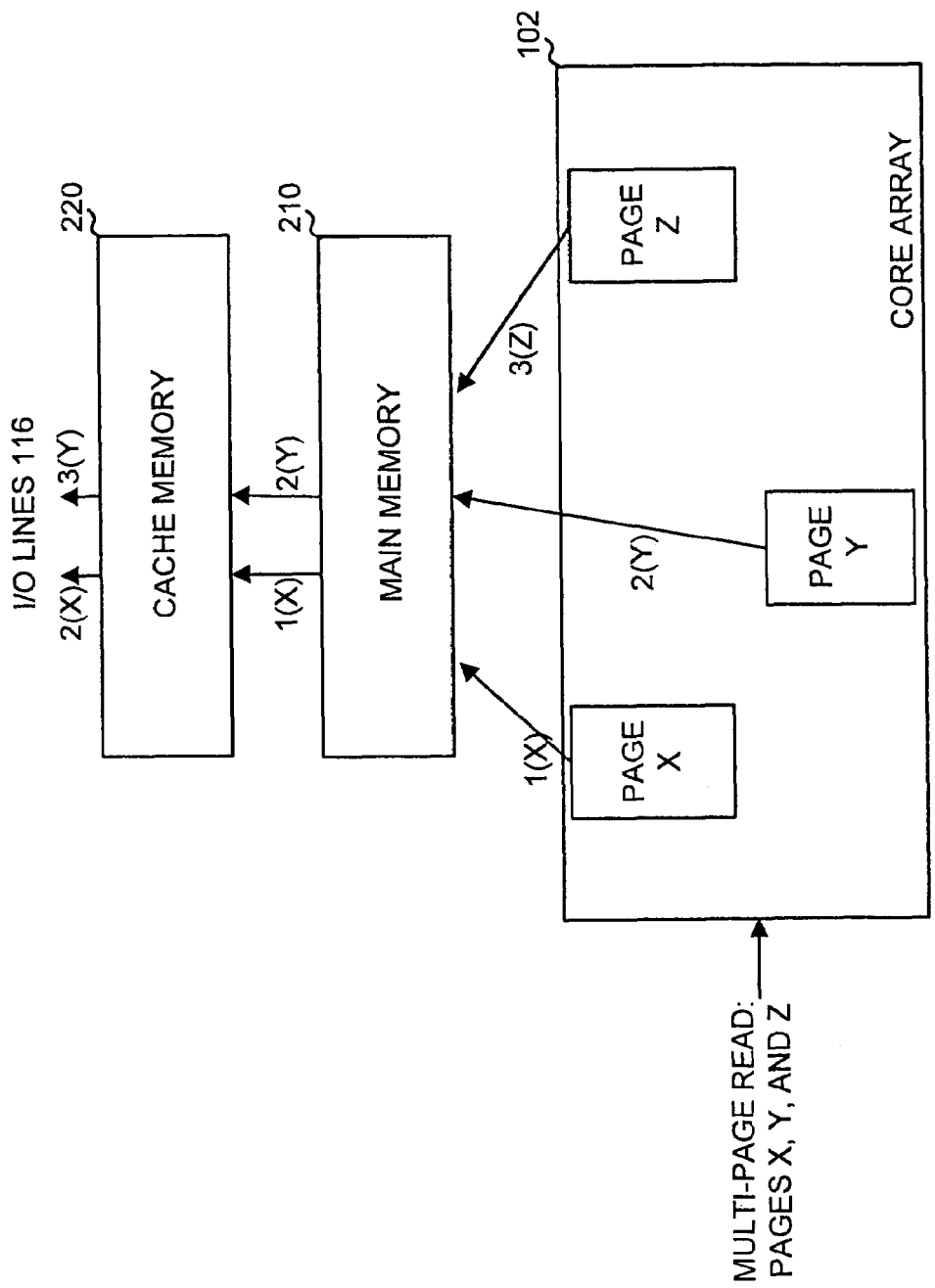
FIG. 4 is a diagram conceptually illustrating an exemplary multi-page read operation.

FIG. 4 is a diagram conceptually illustrating an exemplary multi-page read operation. Assume for this example that the multi-page read operation specifies three pages that are to be read: page X, page Y, and page Z, which are shown in FIG. 4 in various physical locations in core array 102. Pages X, Y, and Z are not necessarily arranged in core array 102 in any particular physical order. That is, pages X, Y, and Z may each be arbitrary pages within core array 102.

Page X may be read from core array 102 and transferred to main memory 210 and then to cache memory 220 in a first transfer period. In a second transfer period, page Y may be read from core array 102 and transferred to main memory 210. while page X is being read out on I/O lines 116. After finishing the reading out of page X, the command/address for page Z may be issued in a third period. The command/address for page Z is also a signal to transfer the data for page Y from main memory 210 to cache memory 220. Thus, in the third transfer period, page Z may be read from core array 102 and transferred to main memory 210. Simultaneously, in the third transfer period, page Y may be read out on I/O lines 116. In this manner, for multi-page read operations, one page is read from core array 102 while another is being output from memory device 100. Advantageously, the overall data transfer rate of memory device 100 can be improved by as much as double the page read speed when a single memory is used to implement output memory 112.

Figure 5:
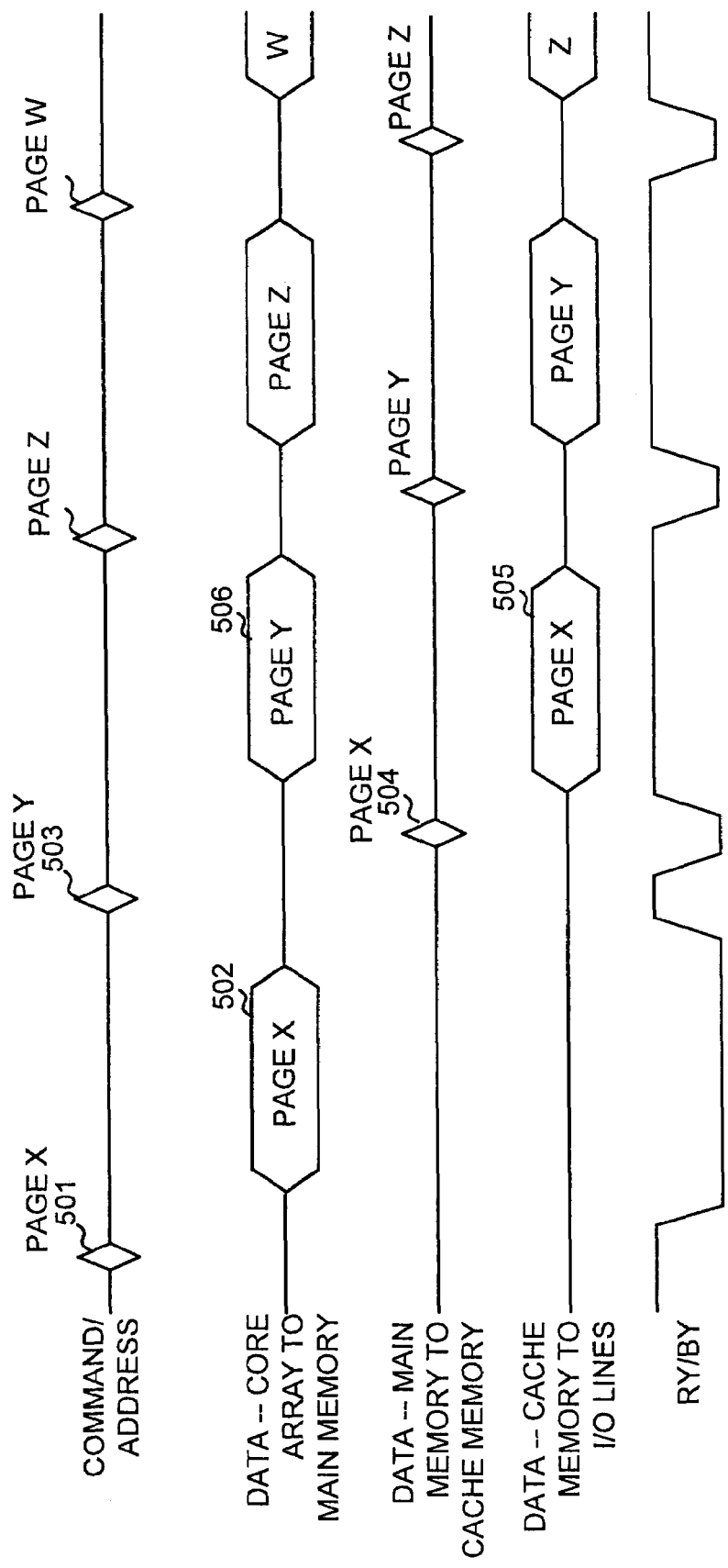
FIG. 5 is an exemplary timing diagram illustrating a multi-page read operation.

FIG. 5 is an exemplary timing diagram illustrating the transfer of the exemplary pages shown in FIG. 4 (pages X, Y, and Z, and an additional page W). As shown, the address lines 501 for the first page (page X) may be received as part of a multi-page read command, which causes page X data 502 to be transferred to main memory. The address lines 503 for page Y may be received as part of a multi-page read command, causing page X data 504 to be transferred from main memory 210 to cache memory 220 and causing page Y data 506 to be transferred from core array 102 to main memory 210. Simultaneous with the transfer of page Y data 506, page X data 505 may be transferred over I/O lines 116 via output buffer 114. This pipelined transfer may then be repeated with page Z being transferred to main memory 210 and page Y being transferred to I/O lines 116.

Ready/busy line 130 are also shown in FIG. 5. Ready/busy line 130 is driven to indicate busy (logic low) when page X is being read from core array 102 or when there is no data ready to be read out of cache memory 220 and driven to indicate ready (logic high) when data is ready to be read out of cache memory 220

CONCLUSION

A multi-page read operation was described in which multiple pages in a Flash memory that may be randomly distributed in the Flash memory can be read in a pipelined manner. The pipelined reading can increase the read speed by as much as two times the read speed of conventional devices.

The foregoing description of exemplary embodiments of the invention provides illustration and description, but is not intended to be exhaustive or to limit the invention to the precise form disclosed. Modifications and variations are possible in light of the above teachings or may be acquired from practice of the invention.

Moreover, while series of acts have been described with regard to FIG. 3, the order of the acts may be varied in other implementations consistent with the invention. Moreover, non-dependent acts may be implemented in parallel.

No element, act, or instruction used in the description of the invention should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed:

1. A non-volatile memory device configured to perform a random multi-page read operation, the memory device comprising:
 a core array of non-volatile memory cells configured to store multiple bits of data per cell;
 input lines for receiving an indication of the random multi-page read operation, including an identification of a plurality of pages of data that are to be read from the core array;
 a volatile memory coupled to the core array and configured to simultaneously process multiple ones of the plurality of pages of data from the core array in a pipelined manner; and
 output lines coupled to the volatile memory and configured to output the pages of data from the non-volatile memory device.

2. The device of claim 1, wherein the volatile memory includes a main memory coupled to the core array and a cache memory coupled to the output lines.

3. The device of claim 2, wherein the main memory and the cache memory include static random access memory (SRAM) cells.

4. The device of claim 1, wherein the core array includes SONOS-type Flash memory cells.

5. The device of claim 1, further including:
 I/O buffers coupled between the volatile memory and the output lines.

6. The device of claim 1, wherein each of the plurality of pages of data includes a plurality of bytes of data stored proximate to one another in the core array.

7. The device of claim 6, wherein each of the plurality of pages of data includes approximately 2 KBytes of data.

8. A memory device comprising:
 a core array of non-volatile memory cells, each of the non-volatile memory cells being configured to store multiple bits of data;
 a first output memory coupled to the core array and configured to receive pages of data from the core array; and
 a second output memory coupled to the first output memory and configured to receive the pages of data from the first output memory, wherein the core array, the first output memory, and the second output memory are configured to perform a page transfer of a first page of data between the core array, the first output memory, and the second output memory in a first pipeline stage while simultaneously performing a page transfer of a second page of data from the second output memory and off of the memory device in a second pipeline stage.

9. The device of claim 8, further comprising:
an output buffer connected to the second output memory, the second pipeline stage including transferring the second page of data between the second output memory and the output buffer for output from the memory device.

10. The device of claim 9, wherein the page transfer of the first page of data between the first core array and the first output memory in the first pipeline stage requires about 25 μs, the page transfer of the second page of data between the first output memory and the second output memory in the second pipeline stage requires about 300 ns, and the page transfer of the second page of data between the second output memory and the output buffer in the second pipeline stage requires about 21 μs.

11. The device of claim 8, wherein the first and second output memories include volatile memory.

12. The device of claim 8, wherein the core array includes SONOS-type Flash memory cells.

13. The device of claim 12, wherein the SONOS-type Flash memory cells are configured to store multiple bits of data per cell.

14. The device of claim 8, wherein the first and second pages of data each include a plurality of bytes of data stored proximate to one another in the core array.

15. The device of claim 14, wherein each of the first and second pages includes approximately 2 KBytes of data.

16. A non-volatile memory device comprising:
input address lines for receiving addresses that are to be read from the memory device;
a core array of non-volatile SONOS-type Flash memory cells configured to store multiple bits of data per cell;
address decoders coupled to the input address lines and the core array of non-volatile memory cells;
a first output memory coupled to the core array and configured to receive pages of data from the core array;
a second output memory coupled to the first output memory and configured to receive the pages of data from the first output memory, the second output memory receiving the pages of data in a pipelined manner relative to the pages of data received by the first output memory;
I/O buffers coupled to the second output memory; and
output lines coupled to the I/O buffers and configured to output the pages of data from the memory device.

17. The memory device of claim 16, wherein the first and second output memories include volatile memories.

* * * * *